United States Patent [19]

Egle et al.

[11] Patent Number: 4,771,178
[45] Date of Patent: Sep. 13, 1988

[54] GONIOMETER STAGE

[75] Inventors: Wilhelm Egle, Aalen; Ernst Gütter, Königsbronn; Hartmut Rösner, Essingen, all of Fed. Rep. of Germany

[73] Assignee: Carl-Zeiss-Stiftung, Heidenheim, Fed. Rep. of Germany

[21] Appl. No.: 946,495

[22] Filed: Dec. 24, 1986

[30] Foreign Application Priority Data

Dec. 24, 1985 [DE]  Fed. Rep. of Germany ....... 3546095

[51] Int. Cl.[4] ............................................. G21K 5/08
[52] U.S. Cl. ................................. 250/442.1; 250/311; 250/491.1; 250/440.1
[58] Field of Search ............... 250/442.1, 440.1, 441.1, 250/311, 491.1; 378/81

[56] References Cited

U.S. PATENT DOCUMENTS 3,823,321  7/1974  Von Rauch ...................... 250/442.1
3,887,811  6/1975  Livesay .............................. 250/442.1
4,058,731 11/1977  Müller et al. .................... 250/442.1
4,405,865  9/1983  Genty et al. ..................... 250/442.1

FOREIGN PATENT DOCUMENTS 2542353  3/1977  Fed. Rep. of Germany ... 250/442.1
5175236 11/1983  Japan ............................... 250/442.1
0230345 11/1985  Japan ............................... 250/442.1

Primary Examiner—Carolyn E. Fields
Assistant Examiner—John A. Miller
Attorney, Agent, or Firm—Walter Ottesen

[57] ABSTRACT

A goniometer stage has a tilting axis which can be adjusted to the point of intersection of the optical axis of the objective lens with the focusing plane. A bearing sleeve for a specimen holder rod is seated with its inner end in a ball-like inner bearing and is connected on its outer end with a cylinder of the tilting device via decoupled positioning devices. The rotational movement of the tilting device is transmitted directly, via a metal bellows from the cylinder to the bearing sleeve.

10 Claims, 2 Drawing Sheets

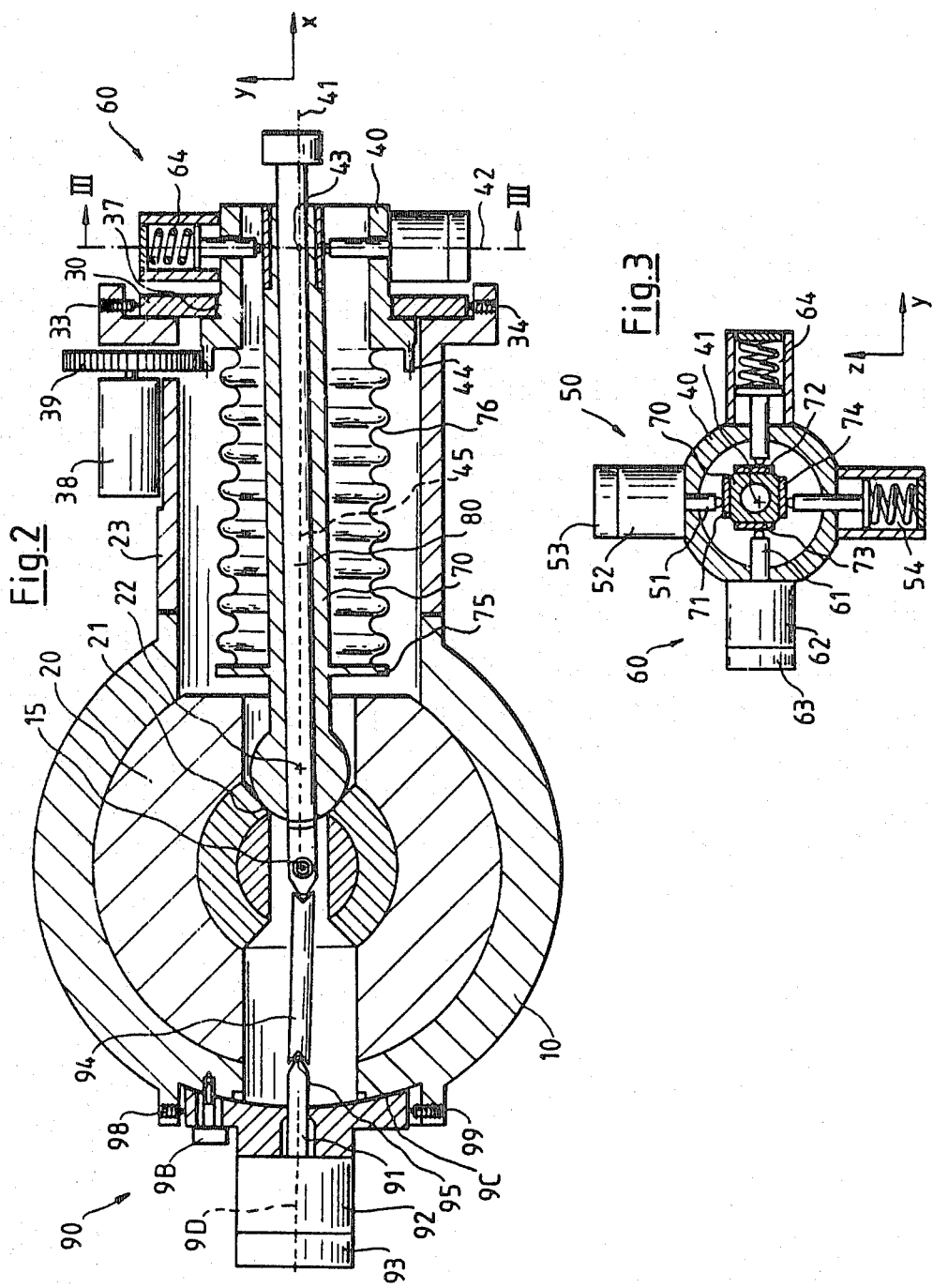

GONIOMETER STAGE

FIELD OF THE INVENTION

The invention relates to a goniometer stage, preferably for electron microscopes, having a bearing sleeve for receiving a specimen holder rod, a tilting device for tilting the bearing sleeve and specimen holder rod. The tilting device is made up of a ball-like inner bearing and an outer bearing having a rotatable cylinder. An adjustment of the cylinder and therewith of the tilting axis is possible by means of an adjusting arrangement. Positioning devices are provided for positioning a section of the specimen which are rotatable in common with the tilting device.

BACKGROUND OF THE INVENTION

In electron microscope investigations it is often necessary to be able to displace the specimen not only in the so-called sharp-focusing plane or (shorter) focusing plane, but also to be able to tilt the same about an axis arranged normal to the optical axis of the electron microscope. Specimen holders suitable for this purpose are generally called goniometric plates, or goniometer stages. When such devices are used, it is naturally advantageous if both the section of the specimen and the focusing are maintained when the specimen is tilted. To attain this, the axis about which tilting is performed must intersect the optical axis of the electron microscope in the focusing plane. Such an axis is known as a eucentric axis. Points on a specimen located on this axis remain unchanged in their spatial position when the specimen is tilted; that is, if the eucentric axis is correctly adjusted and thus the desired section of the specimen, for focusing, is brought to the point of intersection between the optical axis and the eucentric axis by suitable positioning devices of the goniometer stage. Then if the specimen is tilted about the eucentric axis the focusing and the section of the specimen are maintained or are dependent only on the accuracy of the mechanical apparatus involved, as long as the positioning devices are rotated in common with the tilting device.

Philips Technische Rundschau, Volume 29, page 378, 1968 discloses a goniometer stage in which the specimen holder rod is seated in a bearing sleeve that is spherically shaped on its end facing toward the specimen. This end of the bearing sleeve is movable in an inner bearing which is fixedly connected to the objective lens block of the electron microscope. The other end of the bearing sleeve is supported, via two positioning devices for two mutually perpendicular directions (Y, Z) in a rotatable cylinder, which is connected to the microscope column via an outer bearing and a tube. When the cylinder is rotated, the bearing sleeve is rotated as well, via the positioning devices, thereby tilting the specimen holder rod. The tilting axis is determined by the axis of the cylinder, and this axis is aligned to the center point of the ball-like inner bearing. The movement of the specimen in the third spatial coordinate (X) is effected by displacing the specimen holder rod in the bearing sleeve via a micrometer spindle and a pendulum rod on the side of the objective lens housing located opposite the tilting device.

The disadvantage of this goniometer stage is that the tilting axis can be aligned in the horizontal plane only by displacing the entire apparatus with respect to the electron-optical axis of the objective lens. Adjusting the elevation of the tilting axis into the focusing plane of the objective lens is effected by mechanical alignment (that is, adjustment upon assembly) in the objective lens block. Since the micrometer spindle is likewise not adjustable with respect to the tilting axis, the precision of manufacture is decisive for maintaining the X coordinate during tilting. It is most disadvantageous that the rotation of the bearing sleeve is transmitted via the positioning devices for the Y and Z directions, which affects the accuracy of the adjustments and has the effect that at high magnification (greater than 100,000×), the positioned section of the specimen disappears from the viewing screen of the electron microscope when tilted by a large angle (greater than 45°).

U.S. Pat. No. 4,405,865 discloses a goniometer stage that also has a ball-like inner bearing in the objective lens block. In this bearing, a tube is moved that on its outer end is rotatably journalled in a ball guide bushing. The ball guide bushing is connected via a diaphragm with a fitting that is displaceable on a planar surface of the microscope column and thereby enables adjustment of the tilting axis in two mutually perpendicular directions (Y, Z). The tube that is rotatable about the tilting axis is connected on its outer end via positioning devices, which are for two mutually perpendicular directions (Y, Z), with a bearing sleeve that has a further connection with the tube in the vicinity of the ball-like inner bearing, via an inner diaphragm, and thus can be pivoted by the positioning devices about the center point of this diaphragm. By means of a further positioning device, the bearing sleeve also can be positioned, because of the inner diaphragm, in the direction (X) of the axis perpendicular to the diaphragm surface, that is, in the direction of the longitudinal axis of the bearing sleeve.

The disadvantage of this goniometer stage is that the positioning devices for the Y and Z directions comprise firmly attached link joints, so that the adjustments reciprocally affect one another. Furthermore, the center point of the diaphragm is not exactly defined. Because of the great length of the transmission route, positioning for the X direction is very unfavorable in terms of mechanical strength and thermal stability. Furthermore, there is relatively slight variability in the X direction because of the limited deflectability of the inner diaphragm. Finally, the tilting axis is overdefined by the inner bearing and the ball guide bushing.

SUMMARY OF THE INVENTION

It is an object of the invention to provide a goniometer stage which enables easy and accurate adjustment of the tilting axis and which has positioning devices for the desired section of the specimen that enable precise, mechanically and thermally stable displacements of the specimen and are configured in such a way that the specimen section and focusing are maintained during tilting even at high magnification and a large tilting angle.

This object is attained according to a feature of the invention in that the bearing sleeve is adjustable by the adjusting devices about the center point of the ball-like inner bearing, and that the bearing sleeve is connected to the rotatable cylinder via a torsion-resistant bellows.

In a particularly advantageous embodiment, the positioning devices for the Y and Z directions are dependent neither on the tilting about the tilting axis nor on each other. This is attainable for instance by configuring the positioning devices as an accurate right-angle mechanical-stage guide, in which the spindles for the Y and Z displacements are in the same plane and are disposed precisely at right angles to one another.

In a further advantageous feature of the invention, the points of application of the positioning devices for the Y and Z directions are as close as possible to the outer bearing for the rotational movement about the tilting axis.

Particularly good characteristics of the goniometer stage according to the invention are attained by providing: that the structural lengths of the positioning devices for the Y and Z directions are kept very short; that these positioning devices are fully rotated when rotational movements about the tilting axis take place; and, that because of the bellows between the rotatable cylinder and the bearing sleeve, the positioning devices are not used for transmitting the rotational movement to the bearing sleeve.

BRIEF DESCRIPTION OF THE DRAWINGS

The invention will now be described with reference to the drawings wherein:

FIG. 2 is a horizontal section through the goniometer stage along the line II—II of FIG. 1; and, FIG. 3 is a vertical section taken through the positioning devices for the Y and Z directions along the line III—III of FIG. 2.

DESCRIPTION OF THE PREFERRED EMBODIMENTS OF THE INVENTION

Figure 1:
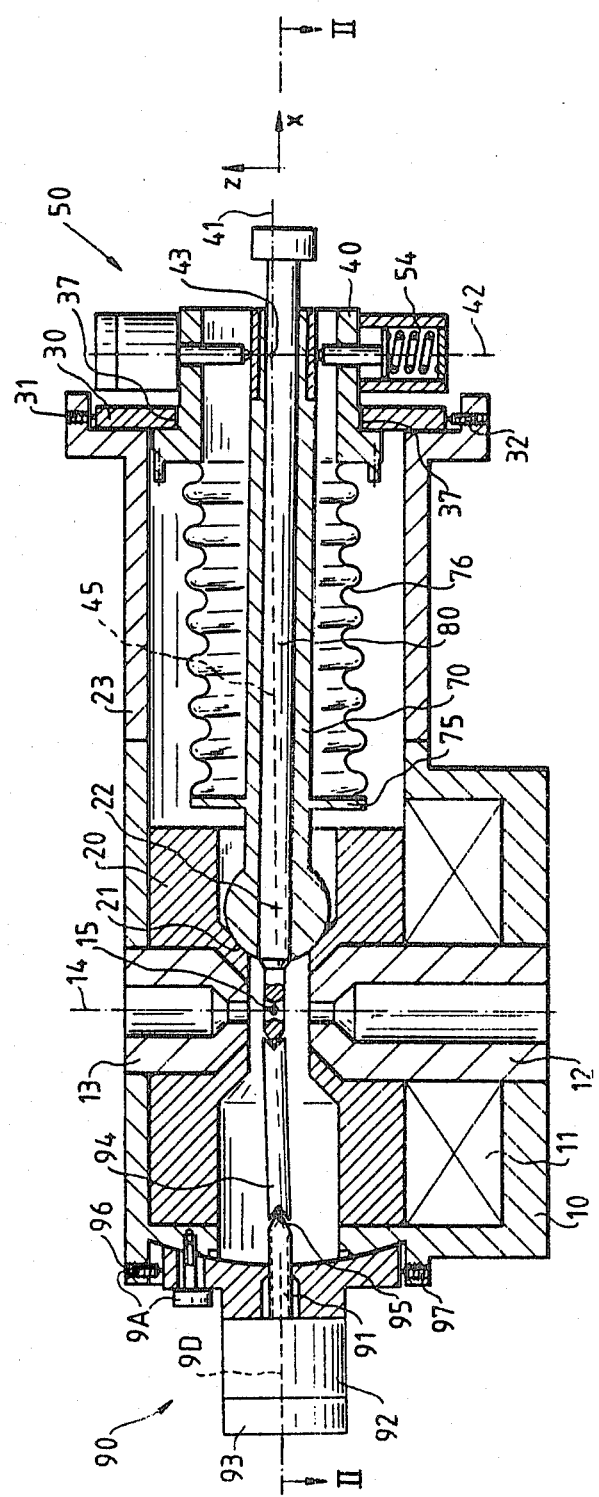
FIG. 1 is a vertical section taken through the goniometer stage.

In FIGS. 1 and 2, reference numeral 10 identifies the housing of the objective lens of the electron microscope. With the coil 11 having electric current flowing therethrough, the magnetic field required for forming an image of the specimen 15 is generated between the pole pieces 12 and 13. In terms of the coordinate directions shown on the right-hand side of the figures, the orientation of the optical axis 14 of the objective lens is, as is typically the case, in the Z direction. The goniometer stage is firmly connected to the objective via the bearing block 20, which has a ball-like inner bearing 21. In this bearing, the ball-like end of the bearing sleeve 70 can be moved about the common center point 22.

The bearing block 20 of the goniometer stage is firmly connected to the housing 23 on which the bearing disc 30 is attached. The bearing disc 30 can be adjusted in the Y-Z plane by adjusting screws 31 and 32 as well as 33 and 34 and fixed with screws not shown. In FIGS. 1 and 2, the bearing disc 30 has intentionally been shown in an exaggeratedly extreme position to show the location of various axes. At its center, the bearing disc 30 has an accurately ground slide bearing 37. The cylinder 40 is rotatably seated in this slide bearing and is secured against displacement in the X direction by two axial roller bearings (not shown). The cylinder 40 may be rotated about its axis 41, for example, by means of the motor 38 attached to the bearing disc 30 via the gear 39 and the gear rim 44.

The cylinder 40 is connected to the outer end of the bearing sleeve 70 (as shown with particular clarity in FIG. 3) via a precise right-angle mechanical-stage guide that assures a displacement of the bearing sleeve 70 in the Y direction and Z direction without reciprocal influence on one another. In the embodiment shown, the mechanical-stage guide comprises two electric motor drives 52 and 62 for the movement of the spindles 51 in the Y and Z directions and resilient restoring means 54 and 64, which act upon the faces 71, 72, 73 and 74 of the bearing sleeve 70, which are disposed precisely at right angles to one another. The drives 52 and 62 are connected directly with position transducers 53 and 63 for transmitting the displacements. By means of the positioning devices 50 and 60, the bearing sleeve 70 is moved about the center point 22 of the ball-like bearing surface 21 in the Y and Z directions.

The bearing sleeve 70 is furthermore connected via the disc 75 and the bellows 76 with the cylinder 40. Because of its torsion-resistant nature, this bellows, which is preferably of metal, transmits the rotational movement of the cylinder 40 to the bearing sleeve 70 without slippage and without play; however, for angular and lateral deflections, the bellows 76 is sufficiently flexible to enable the displacement of the bearing sleeve 70 in the Y and Z directions. Since the rotational movement of the cylinder 40 is transmitted directly to the bearing sleeve 70 via the bellows 76, the adjusting devices 50 and 60 are not subjected to load during a rotational movement; these devices would without the bellows have to transmit the rotational movement and their precision and reproducibility would be thereby negatively influenced.

The points of application of the positioning devices 50 and 60 on the bearing sleeve 70 are located as close as possible to the bearing disc 30, so that wobble errors of the outer bearing 37 have the least possible influence. The points of application can be placed into the plane of the bearing disc 30 with the tilting levers (not shown). Furthermore, it is advantageous for the positioning devices 50 and 60 to be statically balanced with respect to the axis 41 of the cylinder 40, so that upon a rotational movement of the cylinder 40, no changes occur in the forces in the outer bearing 37. For precise and reproducible displacements it is particularly advantageous that the positioning devices 50 and 60 are equipped with short, thermally insensitive and mechanically stable spindles 51 and 61.

Upon a rotation of the cylinder 40, the bearing sleeve 70 and the positioning devices 50 and 60 are rotated about the tilting axis 45, which passes through the center point 22 of the ball-like inner bearing 21 and the point of intersection 43 of the axis 41 of the cylinder 40 with the plane 42 in which the positioning devices 50 and 60 have their points of application upon the bearing sleeve 70.

In the bearing sleeve 70, the specimen holder rod 80 is accommodated in an axially movable manner, with the specimen 15 seated on its inner end. For introducing the specimen into the vacuum and for transferring it out of the vacuum, a vacuum transfer lock, configured in a known manner and not shown in the drawings, is accommodated inside the bearing sleeve 70. In the ball-like end of the bearing sleeve 70, the specimen holder rod 80 is pressed by a spring (not shown) against a V bearing (also not shown), so that it has no radial play and therefore its position with respect to the bearing sleeve is not influenced by gravity upon a rotation of the bearing sleeve 70.

The displacement of the specimen in the X direction is effected by displacing the specimen holder rod 80 in the bearing sleeve 70 by the positioning device 90, which is located on the side of the goniometer stage opposite the tilting device and which acts counter to the air pressure applied externally upon the specimen holder rod 80. The positioning device 90 comprises a spindle 91, which is moved for instance by an electric motor drive 92 having a position transducer 93, and a pendulum rod 94, which transmits the axial movement of the spindle 91 to the specimen holder rod 80 and which upon deflection of the specimen holder rod 80 out of its central position by means of the Y and Z displacement and upon tilting describes a movement on an imaginary conical surface about the tilting axis 45. The positioning device 90 is adjusted relative to the housing 10 or to the bearing block 20 such that the center of the ball 95 on the tip of the spindle 91 lies precisely on the tilting axis 45 or eucentric axis. For this purpose, the positioning device 90 is adjustable in the vertical direction with the adjusting screws 96 and 97 and in the horizontal direction with the adjusting screws 98 and 99 on a spherical surface 9C the center point of which coincides with the center point 22 of the ball-like bearing surface 21. When correctly adjusted, the center axis 9D of the positioning device 90 therefore is located precisely in the extension of the tilting axis 45 or of the eucentric axis. The adjustment is set, that is, fixed, by means of the screws 9A and 9B.

Upon a rotation of the cylinder 40, the specimen 15 is tilted about the tilting axis 45 in the path of the rays of the electron microscope. Since the bearing disc 30 is adjustable in the Z direction and Y direction—as described above—the tilting axis 45 can be adjusted such that it intersects the optical axis 14 of the objective lens in the focusing plane. This tilting axis is known as the eucentric axis. If in this case a specific section of the specimen 15 is moved by means of the positioning devices 50, 60 and 90 into the focusing plane and into the observation field of the electron microscope, then the field is located on the eucentric axis, and if it is tilted the focusing and the selected section of the specimen are maintained.

By means of the adjusting device for the bearing disc 30 in the Z direction (with the aid of the screws 31 and 32), it is possible to drive the objective lens of the electron microscope in various operating modes as well, for example, as a single-field condenser-objective lens for optimal STEM operation or as a so-called second-zone lens for optimal TEM operation, and in this case to always adjust the tilting axis 45 to be precisely on the point of intersection of the objective axis with the focusing plane, so that it becomes the eucentric axis.

The positioning devices 50, 60 and 90 may also be actuated otherwise than by electric motor drives as described for the embodiment here. Mechanical drives with counter mechanisms as position readout devices are particularly simple. Piezoelectric, pneumatic or hydraulic drives can also be used. It is also possible to connect the positioning devices to devices for open-loop or closed-loop control, so that predetermined sections of the specimen 15 can easily be recalled once again, or to enable systematic scanning of the specimen.

It is understood that the foregoing description is that of the preferred embodiments of the invention and that various changes and modifications may be made thereto without departing from the spirit and scope of the invention as defined in the appended claims.

What is claimed is:

1. A goniometer stage for an electron microscope, the goniometer stage comprising:
    a bearing block;
    a specimen holder rod;
    a bearing sleeve positioned to accommodate said specimen holder rod therein;
    a tilting means for tilting said bearing sleeve and said specimen holder rod, said tilting means including:
    a ball-like inner bearing surface defining a center point and being formed on said bearing block for receiving said bearing sleeve thereon;
    an outer bearing;
    a rotatable cylinder rotatably journalled in said outer bearing and defining a tilt axis passing through said center point;
    adjusting means for adjusting the position of said cylinder and said tilt axis;
    positioning means for positioning said bearing sleeve and said specimen holder rod about said center point so as to effect a positioning of a section of a specimen;
    rotation means for imparting rotational movement to said cylinder; and,
    torsion-resistant means connecting said rotatable cylinder to said bearing sleeve for transmitting said rotational movement to the latter while at the same time permitting said positioning thereof.

2. A goniometer stage of claim 1, said torsion-resistant means being a torsion-resistant bellows; said positioning means including two mutually separate positioning devices for positioning the tilting about said tilt axis in the Y and Z directions, respectively, independently of each other.

3. The goniometer stage of claim 2, said positioning devices conjointly defining a mechanical-stage guiding arrangement.

4. The goniometer stage of claim 2, said positioning devices being mounted on said rotatable cylinder for engaging said bearing sleeve in the vicinity of said outer bearing.

5. The goniometer stage of claim 1, said bearing sleeve having a ball-like end for engaging said ball-like inner bearing surface, said goniometer stage further comprising: a V-shaped bearing surface formed in said ball-like end for journalling said specimen holder rod; and, spring means for resiliently biasing said rod against said V-shaped bearing surface.

6. The goniometer stage of claim 1 further comprising:
    a housing for accommodating said bearing block;
    X-direction positioning means for positioning in the X-direction to said tilt axis;
    a spherical surface formed on said housing and defining a center point coincident with said center point of said inner bearing surface; and,
    means for adjusting said X-direction positioning means on said spherical surface.

7. The goniometer stage of claim 2, said positioning devices being selected from the group consisting of mechanical drives, piezoelectric drives, pneumatic drives and electric-motor drives.

8. The goniometer stage of claim 2, said tilting means including position transducers mounted on respective ones of said positioning devices for providing an indication of the coordinates of the adjusted specimen section.

9. The goniometer stage of claim 8, said position transducers and said positioning devices being connected to a control arrangement.

10. The goniometer stage of claim 2, said torsion-resistant bellows being made from a metal selected from the group consisting of tombac, bronze and stainless steel.

* * * * *